(12) United States Patent
Hsieh

(10) Patent No.: US 9,602,067 B2
(45) Date of Patent: Mar. 21, 2017

(54) SWITCHING AMPLIFIER WITH PULSED CURRENT SUPPLY

(76) Inventor: Wen-Hsiung Hsieh, Keelung (TW)

(*) Notice: Subject to any disclaimer, the term of this patent is extended or adjusted under 35 U.S.C. 154(b) by 724 days.

(21) Appl. No.: 13/296,247

(22) Filed: Nov. 15, 2011

(65) Prior Publication Data

US 2013/0121039 A1 May 16, 2013

(51) Int. Cl.
*H03F 3/217* (2006.01)
*H03F 3/38* (2006.01)

(52) U.S. Cl.
CPC ............... *H03F 3/217* (2013.01); *H03F 3/38* (2013.01)

(58) Field of Classification Search
CPC .. H03F 3/217; H03F 3/2173; H03F 2200/351; H03F 1/34; H03F 3/38; H02M 3/33592; H02M 3/33584
USPC ............ 330/10, 251, 207, 207 A; 363/21.06, 363/21.14, 127
See application file for complete search history.

(56) References Cited

U.S. PATENT DOCUMENTS

| | | | |
|---|---|---|---|
| 3,629,616 A | 12/1971 | Walker | |
| 4,399,499 A * | 8/1983 | Butcher et al. | 363/17 |
| 4,531,096 A | 7/1985 | Yokoyama | |
| 5,014,016 A | 5/1991 | Anderson | |
| 5,115,205 A | 5/1992 | Holmes, Jr. | |
| 5,160,896 A | 11/1992 | Mccorkle | |
| 5,590,032 A * | 12/1996 | Bowman et al. | 363/15 |
| 5,781,067 A | 7/1998 | Tota | |
| 5,805,020 A | 9/1998 | Danz | |
| 5,949,282 A | 9/1999 | Nguyen | |
| 5,986,498 A | 11/1999 | Rodriguez | |
| 6,130,828 A * | 10/2000 | Rozman | 363/21.06 |
| 6,356,151 B1 | 3/2002 | Nalbant | |
| 6,392,476 B1 | 5/2002 | Rodriguez | |
| 6,452,818 B1 * | 9/2002 | Simopoulos | 363/21.06 |
| 6,489,839 B2 | 12/2002 | Maaskant | |
| 6,496,059 B1 * | 12/2002 | Nguyen | 330/10 |
| 6,563,377 B2 | 5/2003 | Butler | |
| 6,794,932 B1 | 9/2004 | Butler | |
| 6,844,777 B2 | 1/2005 | Kitamura | |
| 6,859,373 B1 * | 2/2005 | Jin et al. | 363/21.06 |
| 6,922,101 B2 | 7/2005 | Bayko | |
| 7,030,694 B2 | 4/2006 | Jonkman | |
| 7,119,499 B2 * | 10/2006 | Ishigaki et al. | 315/291 |

(Continued)

OTHER PUBLICATIONS

Kaplan—Wiley Electrical Electronics Engineering Dictionary—2004—p. 158.*

(Continued)

*Primary Examiner* — Emily P Pham
*Assistant Examiner* — Kyle J Moody

(57) ABSTRACT

A switching amplifying method or a switching amplifier for obtaining one or more than one linearly amplified replicas of an input signal, is highly efficient, and does not have the disadvantage of "dead time" problem related to the class D amplifiers. Said switching amplifying method comprises the steps of: receiving the input signal; pulse modulating the input signal for generating a pulse modulated signal; switching a pulsed current from a direct current (DC) voltage according to the pulse modulated signal; conducting said pulsed current positively or negatively to a filter according to the polarity of the input signal; filtering said pulsed current positively or negatively conducted to the filter for outputting an output signal by the filter.

21 Claims, 5 Drawing Sheets

(56) References Cited

U.S. PATENT DOCUMENTS

| | | | |
|---|---|---|---|
| 7,170,760 B2* | 1/2007 | Hsieh et al. | 363/16 |
| 7,286,008 B2 | 10/2007 | Watts | |
| 7,307,474 B2 | 12/2007 | Nguyen | |
| 7,400,191 B2 | 7/2008 | Rodriguez | |
| 7,557,655 B2* | 7/2009 | Minteer | 330/195 |
| 7,558,083 B2* | 7/2009 | Schlecht | 363/21.06 |
| 7,633,336 B2 | 12/2009 | Bean | |
| 7,705,672 B1 | 4/2010 | Rodriguez | |
| 7,724,555 B1* | 5/2010 | Simopoulos | 363/127 |
| 7,816,985 B2 | 10/2010 | Attwood | |
| 7,952,426 B2 | 5/2011 | Mun | |
| 7,961,047 B2 | 6/2011 | Pillonnet | |
| 7,969,126 B2 | 6/2011 | Stanley | |
| 8,031,489 B2* | 10/2011 | Wang et al. | 363/21.06 |
| 8,212,613 B1* | 7/2012 | Hsieh | 330/10 |
| 8,228,118 B1* | 7/2012 | Hsieh | 330/10 |
| 8,416,020 B1* | 4/2013 | Hsieh | 330/10 |
| 8,432,221 B1* | 4/2013 | Hsieh | 330/10 |
| 8,760,230 B2* | 6/2014 | Hsieh | 330/251 |
| 2007/0070656 A1* | 3/2007 | Mino | 363/17 |
| 2008/0252370 A1* | 10/2008 | Mun | 330/9 |
| 2009/0059622 A1* | 3/2009 | Shimada et al. | 363/17 |
| 2009/0295349 A1* | 12/2009 | Tao et al. | 323/282 |
| 2009/0309658 A1* | 12/2009 | Mendenhall | 330/251 |
| 2010/0182083 A1* | 7/2010 | Maeda | 330/251 |
| 2011/0026282 A1* | 2/2011 | Chapman et al. | 363/65 |

OTHER PUBLICATIONS

Kaplan—Wiley Electrical Electronics Engineering Dictionary—2004—p. 612.*

S. Boyd, Stanford University, "Lecture 1, Signals", http://web.stanford.edu/~boyd/ee102/signals.pdf, pp. 1-1~1-5, downloaded and printed from internet Oct. 12, 2014.

John Daintith, "bipolar signal", http://www.encyclopedia.com/doc/1O11-bipolarsignal.html, A Dictionary of Computing 2004, originally published by Oxford University Press 2004, printed from internet Oct. 12, 2014.

John Daintith, "unipolar signal", http://www.encyclopedia.com/doc/1011-unipolarsignal.html, A Dictionary of Computing 2004, originally published by Oxford University Press 2004, printed from internet Oct. 12, 2014.

James A. Svoboda, Richard C. Dorf, "1.2 Electric Circuit and Current", Introduction to Electric Circuits 9th Edition, 2014, pp. 2~3, John Wiley & Sons, Inc., U.S.

Sanjaya Maniktala, Switching Power Supplies A-Z, 2006, p. 44, Newnes, Elsevier Ltd., U.S.

Houghton Mifflin Company, "pulse", https://ahdictionary.com/word/search.html?q=pulse, The American Heritage Dictionary of English Language 5th Ed., 2014, Houghton Mifflin Harcourt Publishing Company, printed from internet Nov. 10, 2014.

Semrock Inc., "Laser Damage Threshold", http://www.semrock.com/laser-damage-threshold.aspx, Semrock Inc., New York, printed from internet Nov. 11, 2014.

Wikipedia, "Two-port network", Wikipedia, the free encyclopedia, http://en.wikipedia.org/wiki/Two-port_network, Wikipedia, printed from internet Nov. 11, 2014.

Phillip A. Laplante, "flyback converter", Comprehensive dictionary of electrical engineering 2nd ed., 2005, p. 268, Taylor & Francis Group, LLC.

Phillip A. Laplante, "DC-DC converter", Comprehensive dictionary of electrical engineering 2nd ed., 2005, pp. 174-175, Taylor & Francis Group, LLC.

Wayne Storr, Basic Electronics Tutorials Site, "Introduction to the Amplifier an Amplifier Tutorial", http://www.electronics-tutorials.ws/amplifier/amp_1.html, printed from internet Aug. 12, 2015.

Wayne Storr, Basic Electronics Tutorials Site, "Class a Amplifier—Class-A Transistor Amplifier Tutorial", http://www.electronics-tutorials.ws/amplifier/amp_5.html, printed from internet Aug. 12, 2015.

* cited by examiner

# SWITCHING AMPLIFIER WITH PULSED CURRENT SUPPLY

BACKGROUND OF THE INVENTION (1) Field of the Invention

This invention is related in general to a power amplifier, and more particularly, to a switching amplifier that can efficiently and linearly amplify an input signal having first and second polarities for obtaining a low-distortion output signal.

(2) Description of the Related Art

Amplifiers are electronic devices which are used for increasing the power of a signal, and are generally categorized into various classes. The popular amplifiers include class A, class B and class D amplifiers.

Reference is made to the exemplary U.S. Patents that disclose various types of amplifiers: U.S. Pat. Nos. 7,952,426; 7,816,985; 7,400,191; 7,286,008; 6,922,101; 6,794,932; 6,563,377; 6,356,151; 5,949,282; 5,805,020; 5,160,896; 5,115,205; 5,014,016; 4,531,096 and 3,629,616.

In general, class A amplifiers produce a linearly amplified replica of an input signal, but are inefficient in terms of power usage because the amplifying elements are always biased and conducting, even if there is no input.

Class B amplifiers only amplify half of the input wave cycle, thus creating a large amount of distortion, but their efficiency is greatly improved and is much better than class A. A practical circuit using class B elements is the push-pull stage, such as the very simplified complementary pair arrangement. Complementary or quasi-complementary devices are each used for amplifying the opposite halves of the input signal, which is then recombined at the output. This arrangement gives excellent efficiency, but can suffer from the drawback that there is a small mismatch in the cross-over region—at the "joins" between the two halves of the signal, as one output device has to take over supplying power exactly as the other finishes. This is called crossover distortion.

In a class D amplifier an input signal is converted to a sequence of higher voltage output pulses. The averaged-over-time power values of these pulses are directly proportional to the instantaneous amplitude of the input signal. The frequency of the output pulses is typically ten or more times the highest frequency in the input signal to be amplified. The output pulses contain inaccurate spectral components (that is, the pulse frequency and its harmonics) which must be removed by a low-pass passive filter. The resulting filtered signal is then a linearly amplified replica of the input.

The main advantage of a class D amplifier is power efficiency. Because the output pulses have fixed amplitude, the switching elements are switched either completely on or completely off, rather than operated in linear mode.

However, one significant challenge for a driver circuit in class D amplifiers is keeping dead times as short as possible. "Dead time" is the period during a switching transition when both output MOSFETs are driven into Cut-Off Mode and both are "off". Dead times need to be as short as possible to maintain an accurate low-distortion output signal, but dead times that are too short cause the MOSFET that is switching on to start conducting before the MOSFET that is switching off has stopped conducting. The MOSFETs effectively short the output power supply through themselves, a condition known as "shoot-through". Driver failures that allow shoot-through result in excessive losses and sometimes catastrophic failure of the MOSFETs.

Therefore, the main disadvantage of a class D amplifier is having the "dead time" problem to cause the distortion of the output signal.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are most efficient compared to class A and class B amplifiers, but there is one significant problem for MOSFET driver circuits in class D amplifiers: the "dead time" that cause the distortion of the output signal.

Accordingly, in light of current state of the art and the drawbacks to current amplifiers mentioned above. A need exits for a switching amplifier that would continue to be highly efficient, that would efficiently and linearly amplify an input signal for generating low-distortion output signals.

SUMMARY OF THE INVENTION

The present invention discloses a switching amplifier that produces a linearly amplified replica of an input signal, is highly efficient, and does not have the "dead time" problem related to class D amplifiers.

One aspect of the present invention provides a method of obtaining an output signal, wherein the output signal is a linearly amplified replica of an input signal having first and second polarities, comprising the steps of: receiving the input signal; pulse modulating the input signal for generating a pulse modulated signal; switching a pulsed current according to the pulse modulated signal; conducting said pulsed current positively or negatively to a filter according to the polarity of the input signal; filtering said pulsed current positively or negatively conducted to the filter for outputting the output signal by the filter.

Yet another aspect of the present invention provides a method of obtaining one or more than one slave output signals that are linearly amplified replicas of the input signal.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

The detailed description set forth below in connection with the appended drawings is intended as a description of presently preferred embodiments of the invention and is not intended to represent the only forms in which the present invention may be constructed and or utilized.

Figure 1:
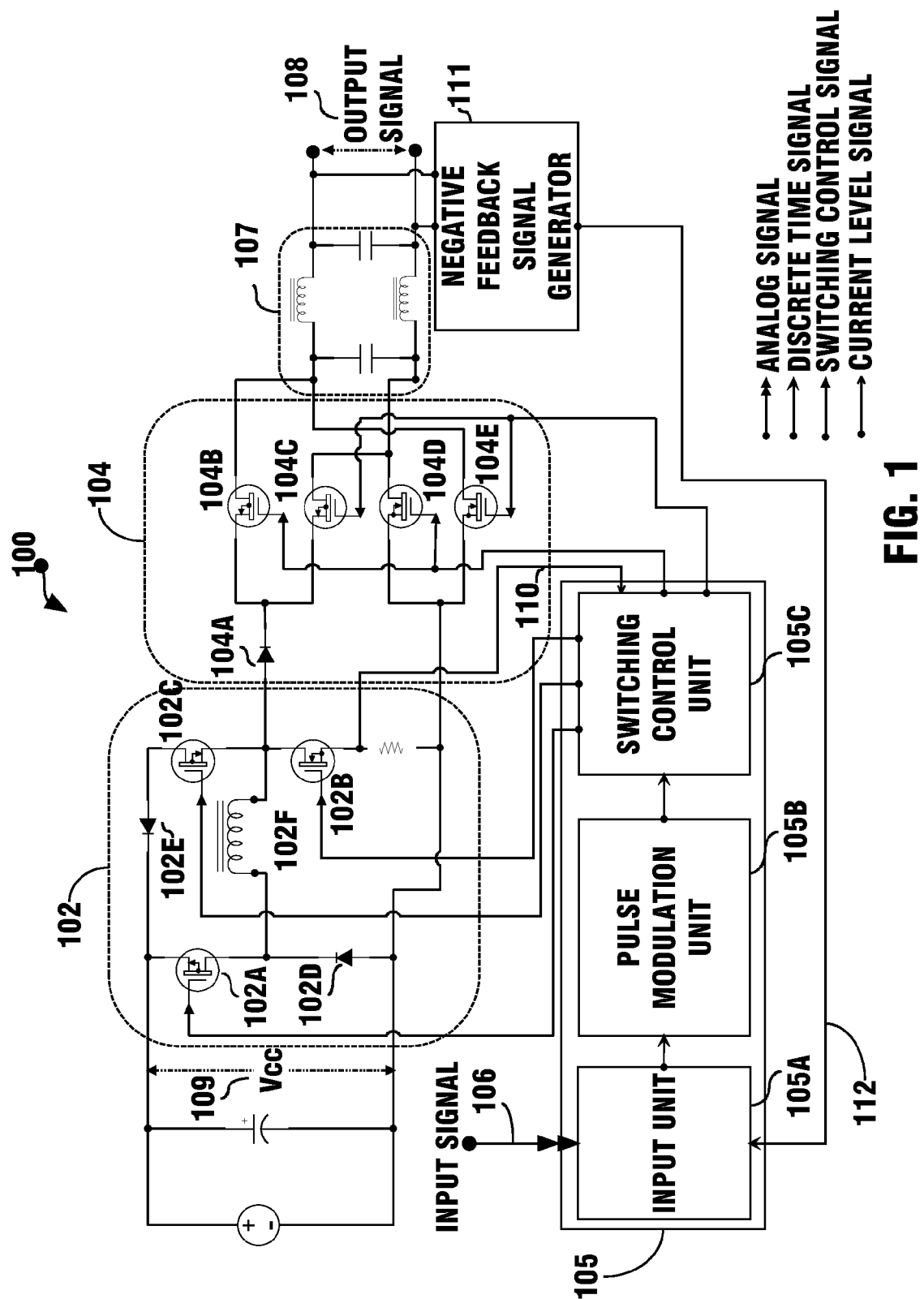
FIG. 1 is an exemplary block and circuit diagram illustrating a first embodiment of a switching amplifier in accordance with present invention, wherein the pulsed current supply unit using an inductor.

FIG. 1 is an exemplary block and circuit diagram illustrating a first embodiment of a switching amplifier 100 in accordance with present invention, wherein the pulsed current supply unit 102 using an inductor 102F.

As illustrated in FIG. 1, the switching amplifier 100 of the present invention for amplifying an input signal 106 having positive and negative polarities is comprised of: a pulsed current supply unit 102 comprising a plurality of switches for switching a pulsed current from a direct current (DC) voltage 109; a switching power transmitting unit 104 comprising a plurality of switches and coupled to the pulsed current supply unit 102 for conducting the pulsed current from the pulsed current supply unit 102 positively or negatively to a filter unit 107; an amplifier control unit 105 for receiving the input signal 106 and coupled to the switches of the pulsed current supply unit 102 and the switching power transmitting unit 104 to control their switching according to the input signal 106; the filter unit 107 to obtain an output signal 108 corresponding to the input signal 106 by filtering the output of the switching power transmitting unit 104 and outputting the output signal 108.

The switching amplifier 100 according to present invention, wherein the pulsed current supply unit 102 comprises: an inductance means 102F; a first switching unit comprising two switches 102A, 102B coupled to the inductance means for switching a current from a direct current (DC) voltage 109 to the inductance means 102F; a second switching unit comprising a switch 102C and two diode 102D, 102E coupled between the inductance means 102F and the direct current (DC) voltage 109 for switching a current from the inductance means 102F to the direct current (DC) voltage 109.

The switching amplifier 100 according to present invention, wherein the switching power transmitting unit 104 comprises: a diode 104A for preventing a current flow from the filter unit 107 to the pulsed current supply unit 102; switches 104B, 104C, 104D, and 104E for transmitting a current from the switching power transmitting unit 104 to the filter unit 107 positively or negatively.

The switching amplifier 100 according to present invention, wherein the filter unit 107 is a low pass filter In this non-limiting exemplary embodiment, the input signal 106 is an analog signal. And it should be noted that it is obvious for a corresponding embodiment of a switching amplifier in accordance with this invention for an input signal which is a discrete time signal.

As further illustrated in FIG. 1, the amplifier control unit 105 comprises an input unit 105A for receiving the input signal 106 and having an analog to digital converter for converting the input signal 106 to a discrete time input signal x [n]

$$x=\{x[n]\},\ 0<n<\infty;$$

a pulse modulation unit 105B for getting a pulse modulated signal from pulse modulating the discrete time input signal x[n]; and a switching control unit 105C coupled to the switches 102A, 102B, and 102C of the pulsed current supply unit 102, the switches 104B, 104C, 104D and 104E of the switching power transmitting unit 104 to control their switching according to the pulse modulated signal from the pulse modulation unit 105B.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

Figure 2:
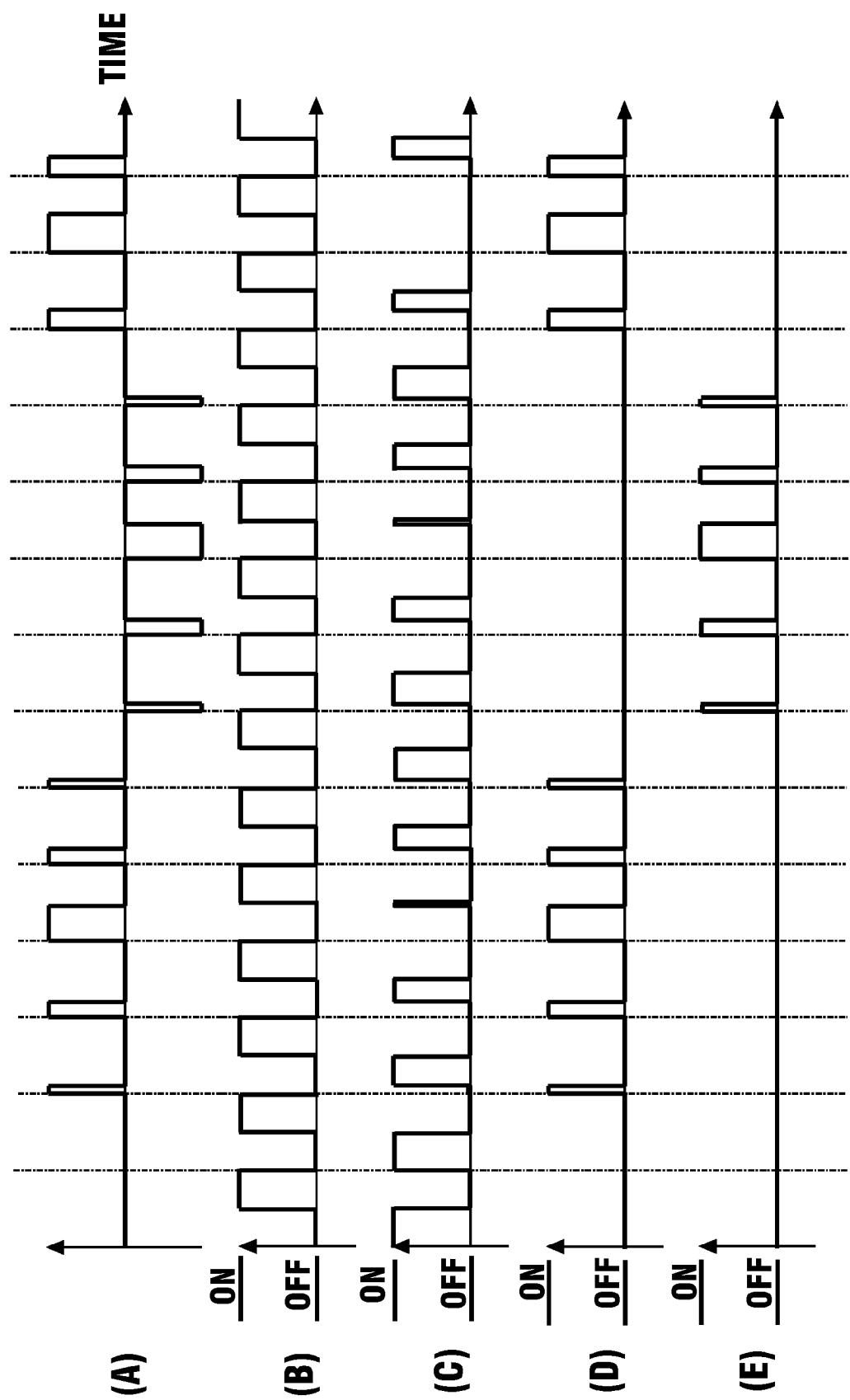
FIG. 2 are exemplary waveform diagrams illustrating the various waveforms at input and output points of a switching control unit of various figures in accordance with the present invention.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105C to the switches 102A and 102B for controlling their switching are illustrated in FIG. 2(B); a non-limiting exemplary waveform of switching control signal from the switching control unit 105C to the switch 102C for controlling its switching is illustrated in FIG. 2(C). Also according to the pulse modulated signal illustrated in FIG. 2(A), non-limiting exemplary waveforms of switching control signals from the switching control unit 105C to the switches 104B, 104D and 104C, 104E are illustrated in FIG. 2(D) and FIG. 2(E), respectively.

Accordingly, as illustrated in FIG. 1 and FIG. 2, when the input signal 106 is zero, the switches 104B, 104C, 104D, 104E of the switching power transmitting unit 104 are all switched off. The switches 102A, 102B and 102C switch on and off alternately to charge and discharge the inductor 102F to regulate current of the inductor 102F: when the switches 102A, 102B switch on and 102C switches off, the inductor 102F is charging energy from the direct current (DC) voltage 109; and when the switches 102A, 102B switch off and 102C switches on, the energy contained in the inductor 102F is discharged back to the direct current (DC) voltage 109. Therefore, at steady state, for approximately equal charging and discharging time, the energy flow in and out of the inductor 102F are equal during each switching, therefore, this switching keeps the energy stored in the inductor 102F constant. For the inductance of the inductor 102F is large enough and the switching frequency of the switches 102A, 102B and 102C is fast enough, the current flow through the inductor 102F keeps approximately constant since its variation is small enough.

When the input signal 106 is not zero, as illustrated in FIG. 1 and FIG. 2(A)~2(E), the switches 102A, 102B, 102C and the switching power transmitting unit 104 switch alternately to keep the energy stored in the inductor 102F constant, therefore when the switching power transmitting unit 104 is switched on, the current from the inductor 102F to the filter 107 keeps constant.

As illustrated in FIG. 1 and FIG. 2(A), 2(D), 2(E) the switches 104B~104E switch for conducting the current from the inductor 102F to the filter unit 107. For the polarity of the pulse modulated signal FIG. 2(A) is positive, the switches 104B, 104D switch on to conduct the current from the inductor 102F to the filter unit 107 positively; otherwise, for the polarity of the pulse modulated signal FIG. 2(A) is negative, the switches 104C and 104E switch on to conduct the current from the inductor 102F to the filter unit 107 negatively.

As further illustrated in FIG. 1, the filter unit 107 is a low pass filter to obtain the output signal 108 corresponding to the input signal 106 by filtering the output of the switching power transmitting unit 104 and outputting the output signal 108.

As further illustrated in FIG. 1 and FIG. 2, the level of the output signal 108 can be adjusted by control the current level of the inductor 102F. Based on the current level feedback signal 110 representing a current flow through the inductor 102F, the switching control unit 105C can adjust the current flow through the inductor 102F by changing the duty ratio between the charging and discharging periods of the inductor 102F according to the current level feedback signal 110.

As further illustrated in FIG. 1, the switching amplifier 100 further comprises a negative feedback signal generator 111 to generate a negative feedback signal corresponding to the output signal 112, wherein the amplifier control unit 105 integrates the input signal 106 and the negative feedback signal 112.

Figure 3:
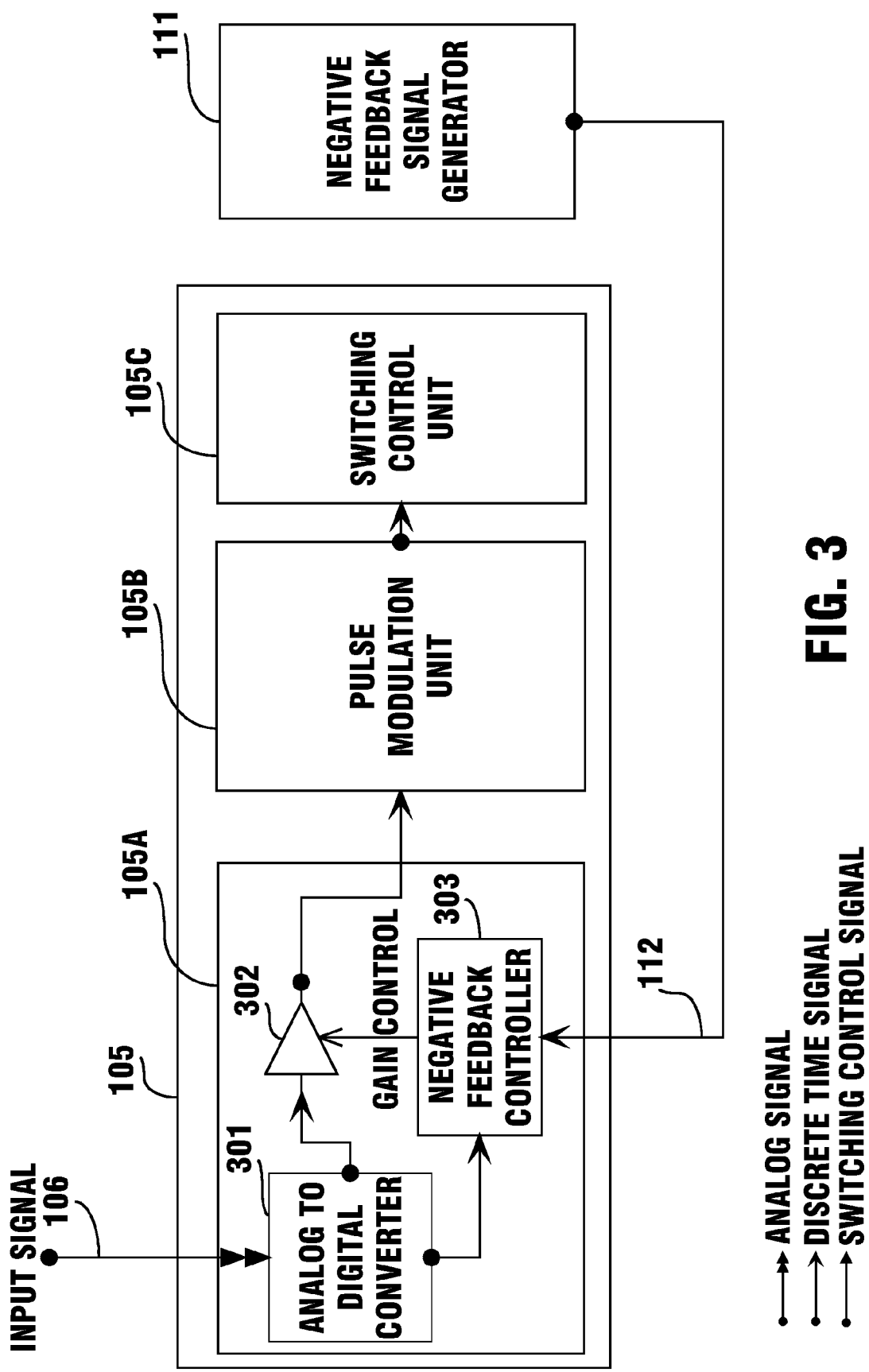
FIG. 3 is an exemplary block and circuit diagram illustrating an embodiment of the amplifier control unit integrating an input signal and a negative feedback signal in FIGS. 1, 4 and 5 in accordance with the present invention.

FIG. 3 is an exemplary block and circuit diagram illustrating an embodiment of the amplifier control unit 105 integrating the input signal 106 and a negative feedback signal 112 in FIG. 1 in accordance with the present invention.

As illustrated in FIG. 3 and FIG. 1, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G\times x[n]\}), 0<n<\infty$$

to get a compensated discrete time signal X[n] and sends the compensated discrete time signal X[n] to pulse modulation unit 105B.

Accordingly, for the switching amplifier 100 further comprises the negative feedback signal generator 111 to generate the negative feedback signal corresponding to the output signal 112 and the amplifier control unit 105 integrates the input signal 106 and the negative feedback signal 112, the pulse modulation unit 105B receives the compensated discrete time signal X[n].

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

Figure 4:
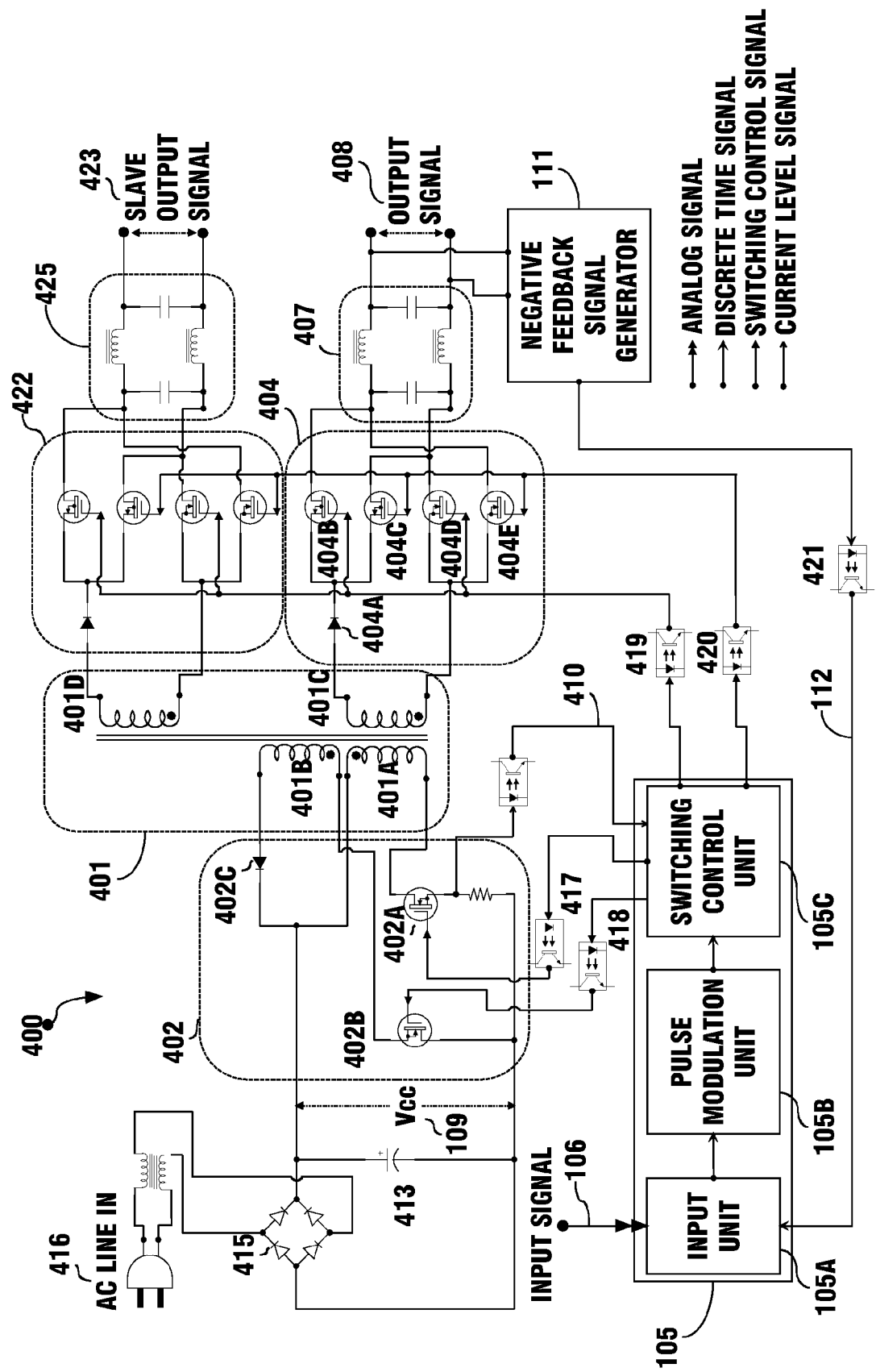
FIG. 4 is an exemplary block and circuit diagram illustrating a second embodiment of a switching amplifier in accordance with present invention, wherein the pulsed current supply unit using a flyback transformer comprising an output winding.

FIG. 4 is an exemplary block and circuit diagram illustrating a second embodiment of a switching amplifier 400 in accordance with present invention.

As illustrated in FIG. 4, the switching amplifier 400 of the present invention for amplifying an input signal 106 having positive and negative polarities is comprised of: a pulsed current supply unit comprising a plurality of switches 402 for switching a pulsed current from a direct current (DC) voltage 109; a switching power transmitting unit 404 comprising a plurality of switches and coupled to the pulsed current supply unit for conducting the pulsed current positively or negatively to a filter unit 407; an amplifier control unit 105 for receiving the input signal 106 and coupled to the switches 402 of the pulsed current supply unit and the switching power transmitting unit 404 to control their switching according to the input signal 106; the filter unit 407 to obtain an output signal 408 corresponding to the input signal 106 by filtering the output of the switching power transmitting unit 404 and outputting the output signal 408.

The switching amplifier 400 of the present invention, wherein its pulsed current supply unit comprises: a flyback transformer 401; a first switching unit 402A coupled to the flyback transformer 401 for switching a current from a direct current (DC) voltage 109 to the flyback transformer 401; a second switching unit 402B coupled between the flyback transformer 401 and the direct current (DC) voltage 109 for switching a current from the flyback transformer 401 to the direct current (DC) voltage 109; wherein the pulsed current supply unit outputs a pulsed current when the switches of the first switching unit 402A and the second switching unit 402B are all switched off. A diode means 402C is for preventing a current flow from the direct current (DC) voltage 109 to the secondary winding 401B.

The switching amplifier 400 of the present invention, wherein the flyback transformer 401 comprises: a primary winding 401A coupled to the first switching unit 402A for charging energy to the flyback transformer from the direct current (DC) voltage 109; a secondary winding 401B coupled to the second switching unit 402B for discharging energy stored in the flyback transformer 401 to the direct current (DC) voltage 109; an output winding unit comprising an output winding 401C for discharging energy stored in the flyback transformer to the output signal 408.

The switching amplifier 400 of the present invention, wherein the switching power transmitting unit 404 comprises: a diode means unit 404A for preventing a current flow from the filter unit 407 to the pulsed current supply unit; a plurality of switches 404B, 404C, 404D, 404E for transmitting a current from the pulsed current supply unit to the filter unit 407 positively or negatively.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105C to the switch 402A for controlling its switching is illustrated in FIG. 2(B); a non-limiting exemplary waveform of switching control signal from the switching control unit 105C to the switch 402B for controlling its switching is illustrated in FIG. 2(C). Also according to the pulse modulated signal illustrated in FIG. 2(A), non-limiting exemplary waveforms of switching control signals from the switching control unit 105C to the switches 404B, 404D and 404C, 404E are illustrated in FIG. 2(D) and FIG. 2(E), respectively.

Accordingly, as illustrated in FIG. 4 and FIG. 2, when the input signal 106 is zero, the switches 404B, 404C, 404D, 404E of the switching power transmitting unit 404 are all switched off. The switches 402A and 402B switch on and off alternately to charge and discharge the flyback transformer 401 to regulate current of the flyback transformer 401: when the switch 402A switches on and 402B switches off, the flyback transformer 401 is charging energy from the direct current (DC) voltage 109; and when the switch 402A switches off and 402B switches on, the energy contained in the flyback transformer 401 is discharged back to the direct current (DC) voltage 109. Therefore, at steady state, for approximately equal charging and discharging time, the energy flow in and out of the flyback transformer 401 are equal during each switching, therefore, this switching keeps the energy stored in the flyback transformer 401 constant. For the inductance of the primary winding 401A is large enough and the switching frequency of the switches 402A and 402B is fast enough, the current flow through the flyback transformer 401 keeps approximately constant since its variation is small enough.

When the input signal 106 is not zero, as illustrated in FIG. 4 and FIG. 2(A)~2(E), the switches 402A, 402B and the switching power transmitting unit 404 switch alternatively to keep the energy stored in the flyback transformer 401 constant, therefore when the switching power transmitting unit 404 is switched on, the current from the flyback transformer 401 to the filter 407 keeps constant.

As illustrated in FIG. 4 and FIG. 2(A), 2(D), 2(E) the switches 404B~404E switch for conducting the current from the flyback transformer 401 to the filter unit 407. For the polarity of the pulse modulated signal FIG. 2(A) is positive, the switches 404B, 404D switch on for conducting the current from the flyback transformer 401 to the filter unit 407 positively; otherwise, for the polarity of the pulse modulated signal FIG. 2(A) is negative, the switches 404C and 404E switch on for conducting the current from the flyback transformer 401 to the filter unit 407 negatively.

As further illustrated in FIG. 4, the filter unit 407 is a low pass filter to obtain the output signal 408 corresponding to the input signal 106 by filtering the output of the switching power transmitting unit 404 and outputting the output signal 408.

As further illustrated in FIG. 4 and FIG. 2, the level of the output signal 408 can be adjusted by control the current level of the flyback transformer 401. Based on the current level feedback signal 410 representing a current flow through the flyback transformer 401, the switching control unit 105C can adjust the current flow through the flyback transformer 401 by changing the duty ratio between the charging and discharging periods of the flyback transformer 401 according to the current level feedback signal 410.

As further illustrated in FIG. 4, the switching amplifier 400 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIG. 4 in accordance with the present invention.

As illustrated in FIG. 3 and FIG. 4, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}), 0<n<\infty;$$

The linear digital transformer 302 transforms the discrete time input signal $x[n]$ by multiplying a gain G to the discrete time input signal (the default value of the gain G is 1):

$$X[n]=\{G \times x[n]\}), 0<n<\infty$$

to get a compensated discrete time signal $X[n]$ and sends the compensated discrete time signal $X[n]$ to pulse modulation unit 105B.

Accordingly, for the switching amplifier 400 further comprises the negative feedback signal generator 111 to generate the negative feedback signal corresponding to the output signal 112 and the amplifier control unit 105 integrates the input signal 106 and the negative feedback signal 112, the pulse modulation unit 105B receives the compensated discrete time signal $X[n]$.

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 508 shows that the output signal 508 is below a required level, then the negative feedback controller 303 will increase the gain G of the linear digital transformer 302 to increase the output signal 508, wherein said required level is obtained according to the discrete time input signal.

In this non-limiting exemplary embodiment 400, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

The switching amplifier 400 according to the present invention further comprising: a rectifying and smoothing unit comprising a full bridge rectifier 415 and a capacitor 413 to rectify and smooth an alternating current (AC) voltage 416 and to provide the direct current (DC) voltage 109.

The switching amplifier 400 according to the present invention further comprising: isolator circuits 417, 418 coupled between the switches 402A, 402B of the pulsed current supply unit and the amplifier control unit 105 to provide electric isolation between them.

The switching amplifier 400 according to the present invention further comprising: isolator circuits 419, 420 coupled between the switching power transmitting unit 404 and the amplifier control unit 105 to provide electric isolation between them.

The switching amplifier 400 according to the present invention further comprising: isolator circuits 421 coupled between the negative feedback signal generator 111 and the amplifier control unit 105 to provide electric isolation between them.

The switching amplifier 400 according to the present invention further comprising: the flyback transformer further comprising one or more than one slave output winding units that each slave winding unit comprises a slave output winding 401D; one or more than one switching power transmitting units 422 and their corresponding filters 425 coupled to the slave output winding units of the flyback transformer 401 for getting or more than one slave output signals 423 corresponding to the input signal.

The switching amplifier 400 according to the present invention further comprising: isolator circuits coupled between the switching power transmitting units 422 and the amplifier control unit 105 to provide electric isolation between the switching power transmitting units 422 and the amplifier control unit 105.

Figure 5:
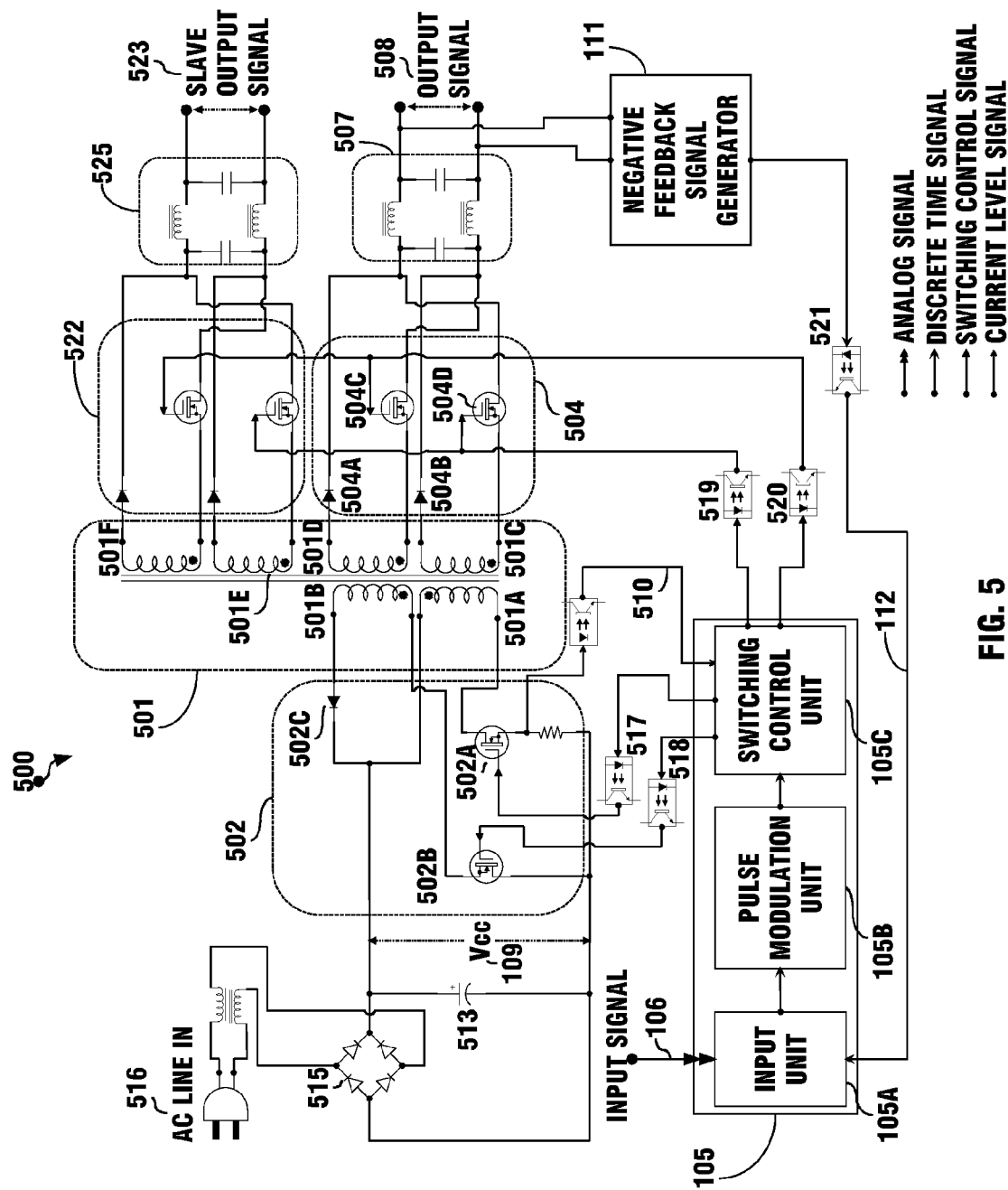
FIG. 5 is an exemplary block and circuit diagram illustrating a third embodiment of a switching amplifier in accordance with present invention, wherein the pulsed current supply unit using a flyback transformer comprising two output windings.

FIG. 5 is an exemplary block and circuit diagram illustrating a second embodiment of a switching amplifier 500 in accordance with present invention.

As illustrated in FIG. 5, the switching amplifier 500 of the present invention for amplifying an input signal 106 comprising positive and negative polarities is comprised of: a pulsed current supply unit comprising a plurality of switches 502 for switching a pulsed current from a direct current (DC) voltage 109; a switching power transmitting unit 504 comprising a plurality of switches and coupled to the pulsed current supply unit for conducting the pulsed current positively or negatively to a filter unit 507; an amplifier control unit 105 for receiving the input signal 106 and coupled to the switches 502 of the pulsed current supply unit and the switching power transmitting unit 504 to control their switching according to the input signal 106; the filter unit 507 to obtain an output signal 508 corresponding to the input signal 106 by filtering the output of the switching power transmitting unit 504 and outputting the output signal 508.

The switching amplifier 500 of the present invention, wherein its pulsed current supply unit comprises: a flyback transformer 501; a first switching unit 502A coupled to the flyback transformer 501 for switching a current from a direct current (DC) voltage 109 to the flyback transformer 501; a second switching unit 502B coupled between the flyback transformer 501 and the direct current (DC) voltage 109 for switching a current from the flyback transformer 501 to the direct current (DC) voltage 109; wherein the pulsed current supply unit outputs a pulsed current when the switches of the first switching unit 502A and the second switching unit 502B are all switched off. A diode means 502C is for preventing a current flow from the direct current (DC) voltage 109 to the secondary winding 501B.

The switching amplifier 500 of the present invention, wherein the flyback transformer 501 comprises: a primary winding 501A coupled to the first switching unit 502A for charging energy to the flyback transformer from the direct current (DC) voltage 109; a secondary winding 501B coupled to the second switching unit 502B for discharging energy stored in the flyback transformer 501 to the direct current (DC) voltage 109; an output winding unit comprising two output windings 501C, 501D for discharging energy stored in the flyback transformer to the output signal 508.

The switching amplifier 500 of the present invention, wherein the switching power transmitting unit 504 comprises: a diode means unit comprising two diodes 504A, 504B for preventing a current flow from the filter unit 507 to the pulsed current supply unit; a plurality of switches 504C, 504D for transmitting a current from the pulsed current supply unit to the filter unit 507 positively or negatively.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105C to the switch 502A for controlling its switching is illustrated in FIG. 2(B); a non-limiting exemplary waveform of switching control signal from the switching control unit 105C to the switch 502B for controlling its switching is illustrated in FIG. 2(C). Also according to the pulse modulated signal illustrated in FIG. 2(A), non-limiting exemplary waveforms of switching control signals from the switching control unit 105C to the switches 504C and 504D are illustrated in FIG. 2(D) and FIG. 2(E), respectively.

Accordingly, as illustrated in FIG. 5 and FIG. 2, when the input signal 106 is zero, the switches 504C, 504D of the switching power transmitting unit 504 are all switched off. The switches 502A and 502B switch on and off alternately to charge and discharge the flyback transformer 501 to regulate current of the flyback transformer 501: when the switch 502A switches on and 502B switches off, the flyback transformer 501 is charging energy from the direct current (DC) voltage 109; and when the switch 502A switches off and 502B switches on, the energy contained in the flyback transformer 501 is discharged back to the direct current (DC) voltage 109. Therefore, at steady state, for approximately equal charging and discharging time, the energy flow in and out of the flyback transformer 501 are equal during each switching, therefore, this switching keeps the energy stored in the flyback transformer 501 constant. For the inductance of the primary winding 501A is large enough and the switching frequency of the switches 502A and 502B is fast enough, the current flow through the flyback transformer 501 keeps approximately constant since its variation is small enough.

When the input signal 106 is not zero, as illustrated in FIG. 5 and FIG. 2(A)~2(E), the switches 502A, 502B and the switching power transmitting unit 504 switch alternately to keep the energy stored in the flyback transformer 501 constant, therefore when the switching power transmitting unit 504 is switched on, the current from the flyback transformer 501 to the filter 507 keeps constant.

As illustrated in FIG. 5 and FIG. 2(A), 2(D), 2(E) the switches 504C, 504D switch for conducting the current from the flyback transformer 501 to the filter unit 507. For the polarity of the pulse modulated signal FIG. 2(A) is positive, the switch 504C switches on for conducting the current from the flyback transformer 501 to the filter unit 507 positively; otherwise, for the polarity of the pulse modulated signal FIG. 2(A) is negative, the switch 504D switches on for conducting the current from the flyback transformer 501 to the filter unit 507 negatively.

As further illustrated in FIG. 5, the filter unit 507 is a low pass filter to obtain the output signal 508 corresponding to the input signal 106 by filtering the output of the switching power transmitting unit 504 and outputting the output signal 508.

As further illustrated in FIG. 5 and FIG. 2, the level of the output signal 508 can be adjusted by control the current level of the flyback transformer 501. Based on the current level feedback signal 510 representing a current flow through the flyback transformer 501, the switching control unit 105C can adjust the current flow through the flyback transformer 501 by changing the duty ratio between the charging and discharging periods of the flyback transformer 501 according to the current level feedback signal 510.

As further illustrated in FIG. 5, the switching amplifier 500 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIG. 5 in accordance with the present invention.

As illustrated in FIG. 3 and FIG. 5, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}), 0<n<\infty$$

to get a compensated discrete time signal X[n] and sends the compensated discrete time signal X[n] to pulse modulation unit 105B.

Accordingly, for the switching amplifier 500 further comprises the negative feedback signal generator 111 to generate the negative feedback signal corresponding to the output signal 112 and the amplifier control unit 105 integrates the input signal 106 and the negative feedback signal 112, the pulse modulation unit 105B receives the compensated discrete time signal X[n].

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 508 shows that the output signal 508 is below a required level, then the negative feedback controller 303 will increase the gain G of the linear digital transformer 302 to increase the output signal 508, wherein said required level is obtained according to the discrete time input signal.

In this non-limiting exemplary embodiment 500, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

The switching amplifier 500 according to the present invention further comprising: a rectifying and smoothing unit comprising a full bridge rectifier 515 and a capacitor 513 to rectify and smooth an alternating current (AC) voltage 516 and to provide the direct current (DC) voltage 109.

The switching amplifier 500 according to the present invention further comprising: isolator circuits 517, 518 coupled between the switches 502A, 502B of the pulsed current supply unit and the amplifier control unit 105 to provide electric isolation between them.

The switching amplifier 500 according to the present invention further comprising: isolator circuits 519, 520 coupled between the switching power transmitting unit 504 and the amplifier control unit 105 to provide electric isolation between them.

The switching amplifier 500 according to the present invention further comprising: isolator circuits 521 coupled between the negative feedback signal generator 111 and the amplifier control unit 105 to provide electric isolation between them.

The switching amplifier 500 according to the present invention further comprising: the flyback transformer further comprising one or more than one slave output winding units that each slave winding unit comprises two slave output windings 501E, 501F; one or more than one switching power transmitting units 522 and their corresponding filters 525 coupled to the slave output winding units of the flyback transformer 501 for getting or more than one slave output signals 523 corresponding to the input signal.

The switching amplifier 500 according to the present invention further comprising: isolator circuits coupled between the switching power transmitting units 522 and the amplifier control unit 105 to provide electric isolation between the switching power transmitting units 522 and the amplifier control unit 105.

From the switching amplifiers 100, 400 and 500 in accordance with the present invention, one aspect of the present invention provides a switching amplifier that is highly efficient and without the "dead time" problem related to the class D amplifiers. Accordingly, the switches of the switching amplifiers 100, 400 and 500 are never short the direct current (DC) voltage through themselves.

From the switching amplifiers 100, 400 and 500 in accordance with the present invention, another aspect of the present invention provides a switching amplifier that its output signal is completely off when there is no input signal, as illustrated in FIG. 2.

From the switching amplifiers 100, 400 and 500 in accordance with the present invention, yet another aspect of the present invention provides a switching amplifier comprised of an act of comparing an input signal with an output feedback signal for detection and correction of overall system signal processes therefore is substantially immune to DC current source supply and load perturbations, as illustrated in FIGS. 1, 4 and 5.

It is to be understood that the above described embodiments are merely illustrative of the principles of the invention and that other arrangements may be devised by those skilled in the art without departing from the spirit and scope of the invention.

What is claimed is:
1. A method of getting an output signal, wherein the output signal is a linearly amplified replica of an input signal, comprising the steps of:
receiving the input signal having first and second polarities;
pulse modulating the input signal for generating a pulse modulated signal;

switching a pulsed current, whose current magnitude is regulated to a constant value when the pulsed current is switched on, according to the pulse modulated signal;

conducting the pulsed current positively or negatively to a filter according to the polarities of the input signal;

filtering the pulsed current positively or negatively conducted to the filter for outputting the output signal from the filter.

2. The method of claim 1, wherein the step of switching the pulsed current, whose current magnitude is regulated to the constant value when the pulsed current is switched on, according to the pulse modulated signal comprises:

switching a first current from a direct current (DC) voltage to an inductance means for charging the inductance means when the first current is switched on;

switching the pulsed current from the inductance means to the filter according to the pulse modulated signal for discharging the inductance means when the pulsed current is switched on;

switching a second current from the inductance means to the direct current (DC) voltage for discharging the inductance means to the direct current (DC) voltage when the second current is switched on;

wherein the inductance means is charged and discharged alternately to regulate the pulsed current flowing from the inductance means when the pulsed current is switched on.

3. The method of claim 2 further comprising:

getting a feedback current signal by detecting a current flowing through the inductance means and integrating the feedback current signal to process a negative feedback control.

4. The method of claim 2 further comprising:

obtaining the direct current (DC) voltage from an alternating current (AC) voltage.

5. The method of claim 2, wherein the inductance means comprises an inductor or a flyback transformer.

6. The method of claim 1 further comprising:

getting a feedback signal by detecting the output signal and integrating the feedback signal to process a negative feedback control.

7. A switching amplifier for amplifying an input signal having first and second polarities, said amplifier comprising:

a pulsed current supply unit for switching a pulsed current whose current magnitude is regulated to a constant value when the pulsed current is switched on;

a switching power transmitting unit comprising a plurality of switches and coupled to the pulsed current supply unit for conducting the pulsed current positively or negatively to a filter unit;

an amplifier control unit receiving the input signal, wherein the amplifier control unit couples to the pulsed current supply unit and the switching power transmitting unit for controlling the pulsed current supply unit and the switching power transmitting unit according to the input signal;

the filter unit coupled to the switching power transmitting unit, wherein the filter unit receives and filters the pulsed current positively or negatively conducted from the switching power transmitting unit to derive an output signal which is an amplified replica of the input signal.

8. The switching amplifier according to claim 7, wherein the pulsed current supply unit comprises:

an inductance means;

a first switching unit comprising at least one switch and coupled to the inductance means for switching a first current from a direct current (DC) voltage to the inductance means for charging the inductance means;

a second switching unit comprising at least one switch and coupled between the inductance means and the direct current (DC) voltage for switching a second current from the inductance means to the direct current (DC) voltage for discharging the inductance means to the direct current (DC) voltage;

wherein the inductance means is charged and discharged alternately to regulate the pulsed current flowing from the inductance means when the pulsed current is switched on.

9. The switching amplifier according to claim 8, further comprising:

a rectifying and smoothing unit to rectify and smooth an alternating current (AC) voltage and to provide the direct current (DC) voltage.

10. The switching amplifier according to claim 8, wherein the inductance means comprises an inductor or a flyback transformer.

11. The switching amplifier according to claim 10, wherein the flyback transformer comprises:

a primary winding coupled to the first switching unit for charging energy to the flyback transformer from the direct current (DC) voltage;

a secondary winding coupled to the second switching unit for discharging energy stored in the flyback transformer to the direct current (DC) voltage;

an output winding unit comprising an output winding or two output windings for discharging energy stored in the flyback transformer through the filter unit to the output signal.

12. The switching amplifier according to claim 11, further comprising:

the flyback transformer further comprising one or more slave output winding units, wherein each slave winding unit comprises a slave output winding or two slave output windings;

one or more switching power transmitting units coupled to said one or more slave output winding units of the flyback transformer;

one or more filter units coupled to said one or more switching power transmitting units for deriving one or more slave output signals corresponding to the input signal.

13. The switching amplifier according to claim 12, further comprising:

isolator circuits coupled between the switching power transmitting units and the amplifier control unit to provide electric isolation between the switching power transmitting units and the amplifier control unit.

14. The switching amplifier according to claim 7, wherein the switching power transmitting unit further comprises:

a diode means unit for preventing a current flow from the filter unit to the pulsed current supply unit.

15. The switching amplifier according to claim 7, further comprising:

a negative feedback signal generator to generate a negative feedback signal corresponding to the output signal, wherein the amplifier control unit integrates the input signal and the negative feedback signal to process a negative feedback control.

16. The switching amplifier according to claim 15, further comprising:

isolator circuits coupled between the negative feedback signal generator and the amplifier control unit to provide electric isolation between the negative feedback signal generator and the amplifier control unit.

17. The switching amplifier according to claim 7, further comprising:
isolator circuits coupled between the pulsed current supply unit and the amplifier control unit to provide electric isolation between the pulsed current supply unit and the amplifier control unit;
or isolator circuits coupled between the switching power transmitting unit and the amplifier control unit to provide electric isolation between the switching power transmitting unit and the amplifier control unit.

18. The switching amplifier according to claim 7, wherein the input signal is an analog signal or a discrete time signal.

19. The switching amplifier according to claim 7, wherein the filter unit is a low pass filter, a band pass filter or a band stop filter.

20. A method of supplying a pulsed current, whose current magnitude is regulated to a constant value when the pulsed current is switched on, comprising:
switching a first current from a direct current (DC) voltage to an inductance means for charging the inductance means when the first current is switched on;
switching the pulsed current flowing from the inductance means for discharging the inductance means through the pulsed current when the pulsed current is switched on;
switching a second current from the inductance means to the direct current (DC) voltage for discharging the inductance means to the direct current (DC) voltage when the second current is switched on;
wherein the inductance means is charged and discharged alternately to regulate the pulsed current flowing from the inductance means when the pulsed current is switched on.

21. The method of claim 20, wherein the inductance means comprises an inductor or a flyback transformer.

* * * * *